(12) United States Patent
Cantillep et al.

(10) Patent No.: US 6,284,572 B1
(45) Date of Patent: Sep. 4, 2001

(54) BOAT AND ASSEMBLY METHOD FOR BALL GRID ARRAY PACKAGES

(75) Inventors: Loreto Yeong Cantillep; Ernesto A. Opiniano, both of Singapore (SG)

(73) Assignee: St Assembly Test Services Pte Ltd., Singapore (SG)

(*) Notice: Subject to any disclaimer, the term of this patent is extended or adjusted under 35 U.S.C. 154(b) by 0 days.

(21) Appl. No.: 09/638,749

(22) Filed: Aug. 14, 2000

(51) Int. Cl.$^7$ ................................................. H01L 21/44
(52) U.S. Cl. ........................ 438/112; 438/124; 257/726
(58) Field of Search ................................ 438/112, 117, 438/124–127; 257/726, 727

(56) References Cited

U.S. PATENT DOCUMENTS

| | | | |
|---|---|---|---|
| 5,695,331 | 12/1997 | Nutter et al. | 432/253 |
| 5,817,545 | * 10/1998 | Wang et al. | 438/127 |
| 5,843,808 | 12/1998 | Karnezos | 438/121 |
| 6,020,597 | * 2/2000 | Kwak | 257/48 |

* cited by examiner

Primary Examiner—David Nelms
Assistant Examiner—David Vu
(74) Attorney, Agent, or Firm—George O. Saile; Stephen B. Ackerman; William J. Stoffel

(57) ABSTRACT

The present invention provides a boat and method for holding one or more substrates during a ball grid array packaging assembly. The boat comprises a base and one or more spring locks. The base has one or more openings which provide access to both faces of said substrates. The base has bottom supports protruding into the openings to retain the substrates from below and top supports protruding into the openings to retain the substrates from above. The spring locks apply lateral pressure to the substrates forcing the substrates over the bottom supports and under the top supports, whereby the boat can be flipped with the substrates retained between the top supports and the bottom supports. In one embodiment, substrates are installed in the boat, and the entire boat is flipped when the opposite face needs to be accessed, rather than manually flipping each substrate.

5 Claims, 3 Drawing Sheets

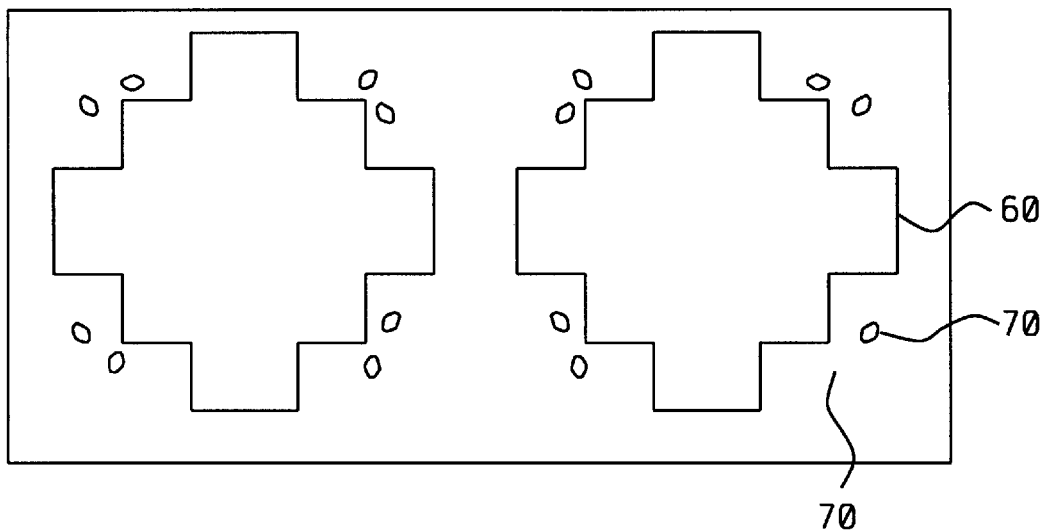
FIG. 1 – Prior Art
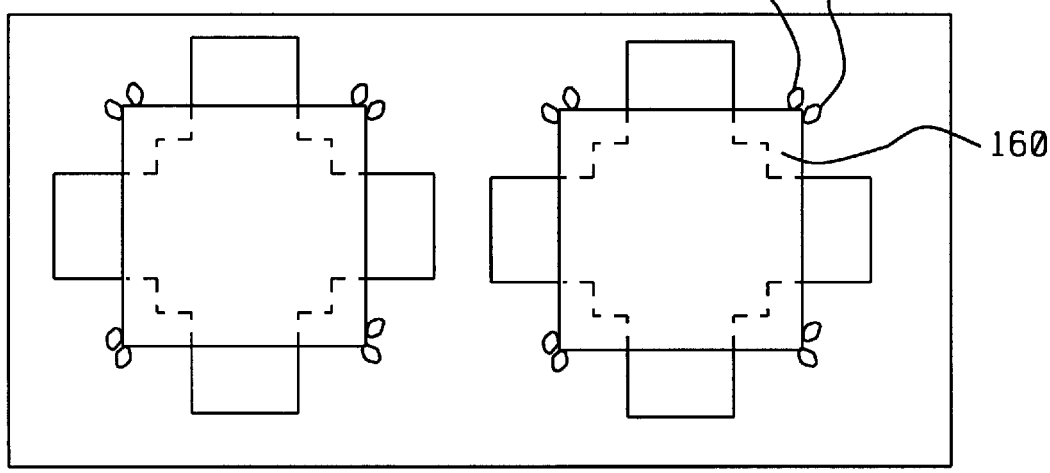
FIG. 2 – Prior Art

BOAT AND ASSEMBLY METHOD FOR BALL GRID ARRAY PACKAGES

BACKGROUND OF INVENTION

1) Field of the Invention

This invention relates generally to fabrication of a semiconductor device and more particularly to a carrier and assembly method for ball grid array packages that replace manual flipping of ball grid array substrates during assembly with flipping the carrier.

2) Description of the Prior Art

Conventionally, Auer boats by Auer Precision Co., Inc. of Mesa, Ariz., are used to hold substrates during processing of ball grid array packages, such as FEBGA and EBGA. Substrates for the ball grid array packages are placed in an Auer boat prior to die attach. The substrates are manually flipped prior to marking. They are manually flipped again prior to ball attach. The manual flipping steps are time consuming, typically requiring 30 to 35 minutes per 200 unit lot. Also, the manual handling operations are a significant cause of quality problems, such as handling damage, electrostatic discharge, and misalignment.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,695,331 (Nutter) shows a multiple width boat carrier. The carrier is adjustable to accommodate various size IC boats.

U.S. Pat. No. 5,843,808 (Karnezos) shows a method for handling TAB grid arrays using a part of the package known as a stiffener as a carrier during assembly.

SUMMARY OF THE INVENTION

It is an object of the present invention to provide a boat and method for holding substrates during ball grid array package fabrication wherein the boat can be flipped rather than manually flipping each substrate.

It is another object of the present invention to provide a boat and method for assembling ball grid array packages wherein the substrates are biases by spring force to reduce dimensional variation during assembly.

To accomplish the above objectives, the present invention provides a boat and method for holding substrates during ball grid array package assembly. The boat comprises a base and one or more spring locks. The base has one or more openings which provide access to both faces of said substrates. The base has bottom supports protruding into the openings to retain the substrates from below and top supports protruding into the openings to retain the substrates from above. The spring locks apply lateral pressure to the substrates forcing the substrates over the bottom supports and under the top supports, whereby the boat can be flipped with the substrates retained between the top supports and the bottom supports. In one embodiment, substrates are installed in the boat, and the entire boat is flipped when the opposite face needs to be accessed, rather than manually flipping each substrate.

The present invention provides considerable improvement over the prior art. By providing access to the opposite face of a substrate by flipping the entire boat rather than manually flipping each substrate, the present invention reduces process time, and reduces quality defects caused by manually handling the substrates. Also, because the substrate is biased against one corner of the opening, alignment tolerance stack-up is reduced.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 and 2 illustrate a boat carrier for holding substrates during ball grid array packaging assembly according to the prior art;

DETAILED DESCRIPTION OF THE INVENTION

The present invention will be described in detail with reference to the accompanying drawings. The present invention provides a boat and method for holding substrates during ball grid array packaging assembly such that the boat can be flipped to provide access to the opposite face of the substrate and continue to retain the substrate.

Problem Identified by the Inventors—FIGS. 1 and 2

FIGS. 1 and 2 show a boat known by the inventors to have a problem. The boat (50) comprises one or more openings (60). These openings are shaped such that they extend beyond the dimensions of a substrate (100) on the edges and are smaller than the substrate in the corners when substrates are placed over the openings. The corners of the substrate rest on the boat (50). The substrate is positioned and aligned by stops (70) which guide the corners of the substrate (100).

The problem with the prior art boats is that each substrate must be manually flipped in order to access its opposite face.

The problem process of the prior art and the process of the present invention are shown in table A. In a typical ball grid array packaging assembly, each substrate must be flipped twice, increasing process time and increasing the risk of handling and electro-static discharge defects.

TABLE A

| prior art | invention |
|---|---|
| install substrates in boat | install substrates in boat |
| die attach | die attach |
| wire bond | wire bond |
| encapsulation | encapsulating |
| manually flip each substrate | flip boat |
| marking | marking |
| manually flip each substrate | flip boat |
| ball attach | ball attach |

Preferred Embodiment of the Present Invention—FIGS. 3–6

Figure 3:
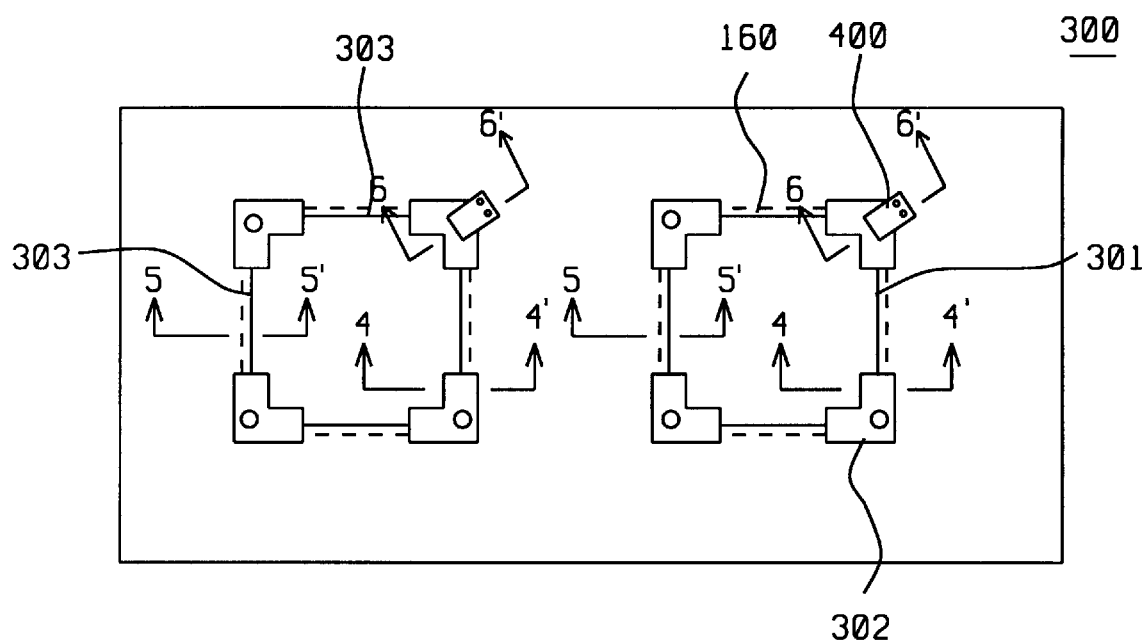
FIG. 3 shows a top view of a boat for holding substrates during ball grid array packaging assembly according to the invention.

Referring to FIG. 3, the preferred embodiment of the present invention begins by providing a boat comprising a base (300), preferably comprised of stainless steel or aluminum with an opening (160) that provides access to either face of a substrate, bottom supports (302), and top supports (303); and a spring lock (400) attached to the base. The boat of the present invention can be flipped and continue to retain substrates.

Figure 4:
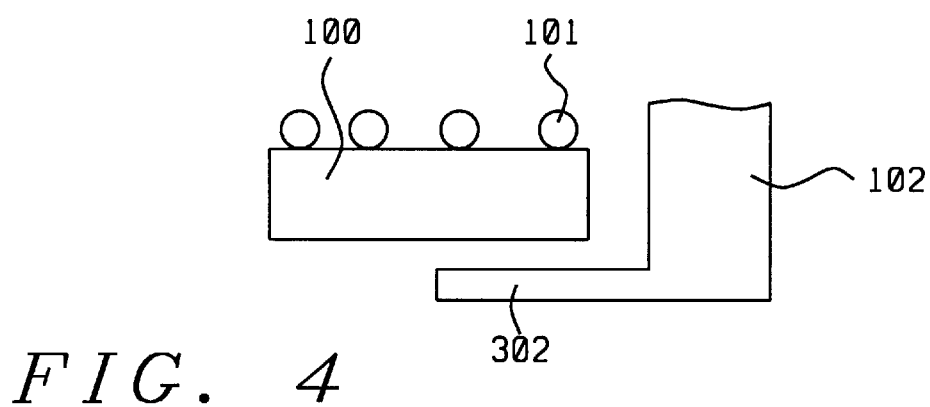
FIG. 4 shows a sectional view of a bottom support of the boat in FIG. 3 taken generally along axis 4–4' holding a substrate.

The bottom supports (302) retain a substrate (100) from the bottom, as shown in FIG. 4. The bottom supports (302) are preferably located at the corners of the opening (160), extending into the opening such that they extend under a substrate. The bottom supports preferably extend under the substrate a distance of between about 0.5 millimeter and 1.2 millimeters. The substrate (100) is preferably placed into the opening in the boat such that the solder balls (101) on the substrate are on the face opposite the bottom supports (302).

Figure 5:
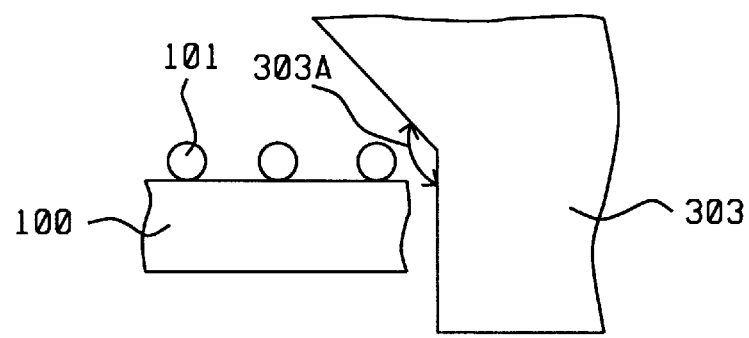
FIG. 5 shows a sectional view of a top support of the boat in FIG. 3 taken generally along axis 5–5' holding a substrate.

The top supports (303) retain a substrate from above, as shown in FIG. 5. The top supports are preferably located at the two adjacent edges of the opening, extending above the sides of the substrate (100). The top supports are preferably angled inward to overhang the substrate and guide the substrate into position. The included angle (303A), between the vertical edge of the base and the angled top support is preferably between about 130 degrees and 160 degrees. The width between opposite top supports is sufficient to allow a substrate to pass between them. When the substrate (100) is biased against one corner of the opening, the adjacent top supports preferably extend a distance of between about 0.2 millimeters and 0.8 millimeters over the substrate. The solder balls (101) on the substrate (101) are preferably on the face of the substrate toward the top supports.

A spring lock (400) is preferably located in one corner of each opening (160) opposite the top supports (303), as shown in FIG. 3. The spring lock comprises a body (401) which is fastened to the base (300). A compression spring (403) fastened to the body (401) applies pressure to a movable pusher (402). The pusher (402) applies force to one corner of a substrate (100), biasing the opposite corner of the substrate against the sides of the opening (160). The biased substrate (100) is forced over the bottom supports and under the top supports, such that it is retained from below and above. The pusher (402) is angled to partially overhang the substrate (100) to help retain the substrate when the boat is flipped. The pusher (402) is preferably at an angle of between about 5 degrees and 45 degrees from vertical and most preferably between about 25 degrees and 40 degrees.

Figure 7:
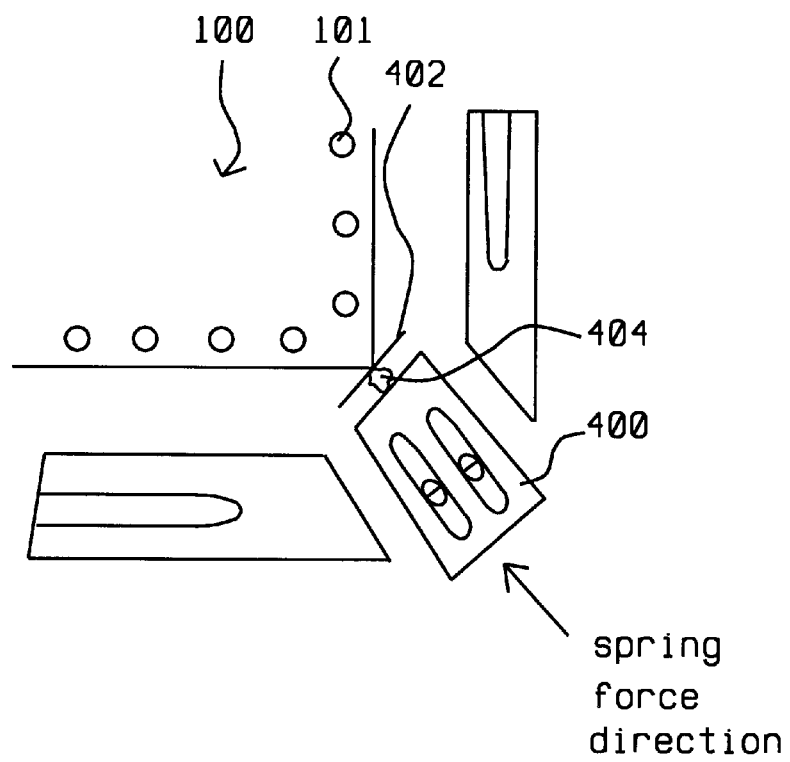
FIG. 7 shows a top view of a spring lock according to the present invention.

FIG. 7 shows a top view of a preferred embodiment of the spring lock (400). The spring is fastened to the base of the boat. A compression spring (403) is fastened between the body (401) and the pusher (402) of the spring lock (400), applying force to the pusher away from the body. When a substrate (100) is placed in the opening in the boat, the pusher abuts the substrate at one corner of the substrate. The force applied by the spring to the pusher is applied by the pusher to the substrate, forcing the substrate away from the spring lock. The force applied to the substrate forces the substrate over the bottom supports and under the top supports opposite the spring lock, allowing the substrate to be retained while the boat is flipped.

Figure 6:
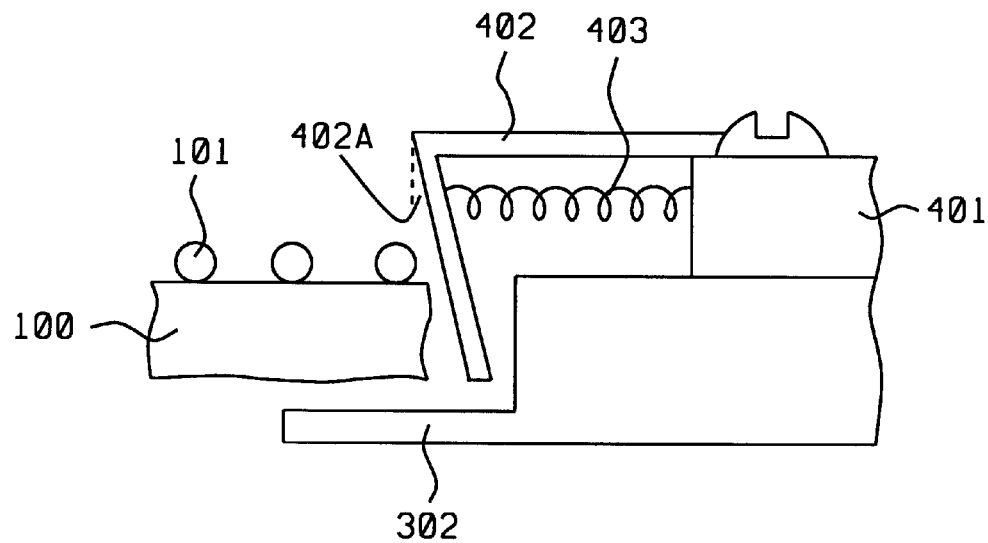
FIG. 6 show a cross sectional view of a spring lock of the boat in FIG. 3 taken generally along axis 6–6' holding a substrate.

In a preferred process of the present invention, the steps where each substrate is manually flipped prior to marking and prior to ball attach are replaced by steps in which the entire boat is flipped with the substrates retained thereon. The substrates are placed in the boat by retracting the pusher (402) of spring lock (400) and setting a substrate (100), with solder balls (101) facing up, into the opening, resting on the bottom supports, as shown in FIG. 6. When the spring lock pusher is released, it applies force to the substrate forcing it against the walls of the opening opposite the corner where force is applied by the spring lock. The force applied to the substrate forces the substrate over the bottom supports opposite the spring lock and under the top supports opposite the spring lock.

The key advantages of the present invention are that, by flipping the entire boat prior to marking and prior to ball attach, each substrate does not need to be manually flipped. Eliminating the manual flipping of each substrate reduces process time by about 30 minutes for each 200 unit lot. Quality defects induced by manual handling, such as handling damage, electro-static discharge, and misalignment/misregistration, can be reduced. Also, because the present invention biases the substrate against one corner of the opening, alignment tolerance stack-ups are reduced.

While the invention has been particularly shown and described with reference to the preferred embodiments thereof, it will be understood by those skilled in the art that various changes in form and details may be made without departing from the spirt and scope of the invention.

What is claimed is:

1. A method for assembling ball grid array packages, comprising the steps of:

(a) installing one or more substrates into a boat; wherein said boat has one or more openings for retaining said substrates providing access to both faces of said substrates; said boat having bottom supports to retain said substrates from below, top supports to retain said substrates from above, and a means for biasing said substrates against one corner of said openings;

(b) attaching dies to said substrates;

(c) performing wire bond to form electrical contact between said die and said substrate;

(d) encapsulating said die;

(e) flipping said boat to provide access to the opposite face of said substrate;

(f) marking said substrates;

(g) flipping said boat to provide access to the opposite face of said substrate; and (h) attaching solder balls to said substrate.

2. The method of claim 1 wherein said means for biasing said substrate against one corner of said opening is a spring lock wherein the spring applies force to a corner of said substrate through a movable pusher.

3. The method of claim 2 wherein said substrates are installed in said openings by retracting said movable pusher and placing said substrates into said openings between said top supports and resting on said bottom supports; then releasing said movable pusher; whereby said movable pusher applies a force to said substrate, biasing said substrate against the walls of said opening opposite said spring lock.

4. The method of claim 2 wherein the face of said movable pusher in contact with said substrate is at an angle of between about 5 degrees and 45 degrees from vertical.

5. The method of claim 2 wherein the face of said movable pusher in contact with said substrate is at an angle of between about 20 degrees and 40 degrees from vertical.

* * * * *